(12) United States Patent
Raeth (10) Patent No.: US 11,129,305 B2
(45) Date of Patent: Sep. 21, 2021

(54) LIQUID COOLING SYSTEM FOR AN ELECTRONIC CARD WITH A COLD PLATE AND HEAT SINKS CONNECTED TO THE COLD PLATE BY FLEXIBLE CONNECTIONS

(71) Applicant: BULL SAS, Les Clayes Sous Bois (FR)

(72) Inventor: Marc Raeth, Tacoignieres (FR)

(73) Assignee: BULL SAS, Les Clayes Sous Bois (FR)

(*) Notice: Subject to any disclaimer, the term of this patent is extended or adjusted under 35 U.S.C. 154(b) by 0 days.

(21) Appl. No.: 16/772,915

(22) PCT Filed: Dec. 13, 2018

(86) PCT No.: PCT/FR2018/053276
§ 371 (c)(1),
(2) Date: Jun. 15, 2020

(87) PCT Pub. No.: WO2019/115963
PCT Pub. Date: Jun. 20, 2019

(65) Prior Publication Data
US 2021/0076539 A1    Mar. 11, 2021

(30) Foreign Application Priority Data
Dec. 15, 2017   (FR) ...................................... 1762254

(51) Int. Cl.
*H05K 7/20*    (2006.01)

(52) U.S. Cl.
CPC ..... *H05K 7/20772* (2013.01); *H05K 7/20254* (2013.01); *H05K 7/20409* (2013.01)

(58) Field of Classification Search
None
See application file for complete search history.

(56) References Cited

U.S. PATENT DOCUMENTS

| 6,016,251 A * | 1/2000 | Koide ................... H01L 23/473 |
| | | 361/699 |
| 9,292,058 B2 | 3/2016 | Demange |
| 9,462,728 B2 | 10/2016 | Demange et al. |
| 9,943,016 B2 * | 4/2018 | Pietrantonio ...... H05K 7/20927 |
| 10,168,749 B2 * | 1/2019 | Aoki ....................... H01L 23/40 |
| 2002/0113142 A1 * | 8/2002 | Patel ................... H01L 23/4735 |
| | | 239/128 |
| 2005/0241799 A1 * | 11/2005 | Malone ..................... G06F 1/20 |
| | | 165/80.1 |
| 2006/0050483 A1 * | 3/2006 | Wilson .................. H01L 23/473 |
| | | 361/702 |

(Continued)

FOREIGN PATENT DOCUMENTS

| EP | 2 770 809 A1 | 8/2014 |
| EP | 2 770 810 A1 | 8/2014 |

OTHER PUBLICATIONS

International Search Report dated Apr. 18, 2019 from PCT priority Application No. PCT/FR2018/053276 (four pages including English translation).

(Continued)

*Primary Examiner* — Courtney L Smith
(74) *Attorney, Agent, or Firm* — Crowell & Moring LLP; John C. Freeman (57) ABSTRACT
A liquid cooling system for a circuit board made up of a cold plate and heat sinks connected to the cold plate by flexible connections.

7 Claims, 7 Drawing Sheets

(56) References Cited

U.S. PATENT DOCUMENTS

| | | | |
|---|---|---|---|
| 2009/0294106 A1 | 12/2009 | Flotta et al. | |
| 2010/0231250 A1* | 9/2010 | Breinlinger | G01R 31/2889 324/750.08 |
| 2011/0103019 A1* | 5/2011 | Campbell | H05K 7/20236 361/702 |
| 2012/0160459 A1 | 6/2012 | Flotta et al. | |
| 2012/0257354 A1* | 10/2012 | Dede | H01L 23/4735 361/703 |
| 2014/0233174 A1 | 8/2014 | Demange | |
| 2014/0233175 A1 | 8/2014 | Demange et al. | |
| 2015/0131224 A1* | 5/2015 | Barina | G06F 1/20 361/679.53 |
| 2015/0208555 A1 | 7/2015 | Flotta et al. | |
| 2016/0118317 A1* | 4/2016 | Shedd | F25B 23/006 257/712 |
| 2020/0390007 A1* | 12/2020 | Edmunds | H05K 7/20272 |

OTHER PUBLICATIONS

Written Opinion dated Apr. 18, 2019 from PCT priority Application No. PCT/FR2018/053276 (seven pages—foreign text).

* cited by examiner

PRIOR ART

Fig. 1

PRIOR ART

Fig. 2

PRIOR ART

Fig. 12 though the rigidity of the copper pipes 11' does not
LIQUID COOLING SYSTEM FOR AN ELECTRONIC CARD WITH A COLD PLATE AND HEAT SINKS CONNECTED TO THE COLD PLATE BY FLEXIBLE CONNECTIONS This application is a National Stage application of International Application No. PCT/FR2018/053276, filed Dec. 13, 2018, the entire contents of which are incorporated herein by reference.

This application claims priority under 35 U.S.C. § 119(a) to French Patent Application No. 1762254, filed on Dec. 15, 2017, the entire contents of each of which are incorporated herein by reference.

BACKGROUND OF THE INVENTION

Field of the Invention

The present invention relates to a liquid cooling system for a circuit board including at least one computing processor.

Description of the Related Art

Server compute blades generally have circuit boards that give off heat and therefore need to be cooled. Originally, these circuit boards were cooled by air. However, in the case of rack-mounted servers, the circulation of air is insufficient for cooling the circuit boards.

To solve this problem, fluidic cooling systems have been developed.

Figure 1:
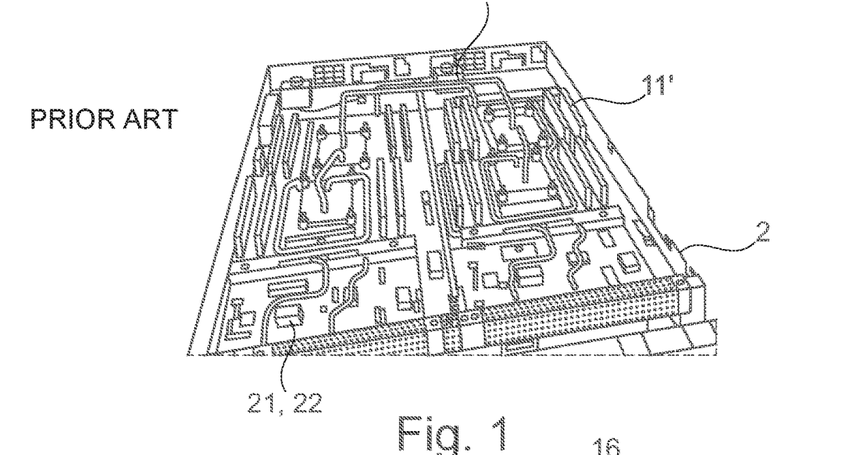
FIG. 1 shows a mixed cooling system for a dual-processor circuit board of the prior art.

Among the known solutions for cooling circuit boards, the company IBM has developed a mixed cooling system 1' for dual-processor circuit boards 2 for supercomputers, which is shown in FIG. 1. Such a system includes copper pipes 11' containing a heat transfer liquid forming a liquid loop. However, the rigidity of the copper pipes 11' does not allow rapid dismounting of an individual processor. Moreover, the liquid loop provides cooling only of the processors. The rest of the power dissipated is cooled by convection in the air, this not being optimal for the power usage effectiveness (PUE) of the supercomputer.

Other circuit board manufacturers provide liquid cooling systems dedicated only to processors. The latter incorporate a heat sink, an integrated pump and a heat exchanger for removing heat energy. Of course, such devices are not compatible with larger-scale systems such as supercomputers for size reasons.

Furthermore, the applicant company has developed a mixed cooling system 1 (illustrated in FIG. 3) in which the circuit boards 2 are cooled via a cold plate 11 made of aluminum in which a heat transfer liquid flows, the cold plate 11 being interfaced with all of the low-level and mid-level electronic components to be cooled, that is to say all of the components of a circuit board 3 apart from the high-level electronic components (typically the processors and the memory modules). The processors 23 (not visible in FIG. 3) are the components that are the most awkward to cool (since they need to remain accessible) and also the most dissipative. They cannot be directly interfaced with the cold plate 11. In order to ensure thermal contact with the processors 23, each of these is interfaced with an intermediate heat sink 16 having heat pipes 160 (illustrated in FIG. 2). This is a two-phase heat sink 16 with phase change (also known as a heat spreader CPU), which conducts the heat from the processors 23 to the cold plate 11. The part of the heat pipes 160 in contact with the copper tile interfacing with the processor 23 constitutes the evaporator 162, while the part in contact with the interface with the cold plate 11 constitutes the condenser 163. This solution is described in more detail in the applicant company's European patent applications EP 2770809 and EP 2770810.

This solution for cooling processors with the aid of heat pipes also has drawbacks, and in particular:

thermal limits specific to the heat pipes: the flow inside a heat pipe is two-phase and is governed by five limits in terms of flow, viscosity, boiling, entrainment, capillarity, which depend on the dimensions of the heat pipes and the power to be evacuated.

mechanical limits: the increase in the number of heat pipes brings about an increase in the rigidity of the assembly. However, in order to compensate for differences in tolerances, it is desirable that the heat sink deform sufficiently.

a high number of removable thermal interfaces: thermal contacts need to be ensured between the cold plate and the heat sink, and between the heat sink and the processor. These thermal contacts are ensured in the current solution implemented by the applicant company by the use of conductive grease, this having the drawback of generating a high temperature gradient.

the complexity and the cost of the solution as a whole: the solid/fluid exchange surfaces are currently in the region of the cold plate. The complexity thereof in heat sinks considerably increases the machining operations in the cold plate and thus the manufacturing cost.

SUMMARY OF THE INVENTION

In order to resolve the abovementioned defects and drawbacks, the applicant company has therefore developed a cooling system for a circuit board that is entirely liquid, including a cold plate supplied with heat transfer fluid via a water path internal to the cold plate, and a plurality of heat sinks connected to the water path internal to the cold plate by flexible connections. These flexible connections form a flexible network coupled to the network of rigid ducts of the cold plate supplied with heat transfer fluid (typically glycol water), thereby making it possible to supply the heat sinks with heat transfer fluid. This network will need to be coupled to the cold plate system for cooling the rest of the circuit board.

In order to optimize the cooling of the processor as much as possible, the heat transfer liquid should be brought as close as possible to the heat source. To this end, the applicant company has specifically developed a single-phase heat sink comprising a cooling block made of heat conducting material that can be supplied with heat transfer fluid. The heat source formed by the processor will thus be directly interfaced with this cooling block (also designated "waterblock" in the examples) supplied with heat transfer fluid taken from the cold plate. Such an integrated cooling system meets the requirements of thermal efficiency, mechanical compactness and maintainability necessary for this type of high-performance computer hardware.

More particularly, the subject of the present invention is therefore a liquid cooling system for a circuit board including a substrate and a plurality of electronic components secured to said substrate that are made up of low-level and mid-level electronic components and of high-level electronic components (preferably processors), the system including:

a cold plate having external dimensions more or less equal to those of the substrate of the circuit board such that it covers the entire substrate and the low-level and mid-level electronic components, the cold plate being a plate made of a heat conducting material and including a primary cooling circuit with main ducts (preferably rigid) within which a heat transfer fluid flows, the heat transfer fluid being fed into the cold plate via an inlet connector and the heat transfer fluid being discharged from the cold plate via an outlet connector, a plurality of heat sinks, each including a main heat exchange zone that is able to bear against a high-level electronic component, the liquid cooling system being characterized in that it also has a secondary circuit of flexible secondary ducts connected to the main ducts of the primary circuit by angled connectors secured in the cold plate (for example by being screwed into the cold plate), and in that the heat sinks are single-phase heat sinks, which each includes:

a cooling block made of heat conducting material (typically made of aluminum or an aluminum alloy) including a lower part forming the main heat exchange zone, an intermediate part known as the distribution part, and an upper part connected to the cold plate, an inlet duct and an outlet duct that are connected, for the one part, to the upper part of the cooling block via an inlet connector and an outlet connector, respectively, and, for the other part, to a flexible secondary duct of the secondary circuit via an angled connector, such that the cooling block is supplied with the heat transfer fluid flowing in the cold plate, the angled connectors being able to allow the inlet and outlet ducts to rotate with respect to the flexible secondary duct to which they are connected, and in that the cooling block also includes:

a through-slot situated in the intermediate part in order to uniformly distribute the flow of the heat transfer fluid coming from the upper part in the form of a centered jet toward a support plate that is situated in the main heat exchange zone and includes a recessed central part with a zone provided with fins or spikes in order to generate turbulence in the flow conditions of the heat transfer fluid, and a zone peripheral to the zone provided with fins or spikes in order to receive the heat transfer fluid and direct it toward said outlet connector.

The cooling system according to the present invention thus makes it possible to ensure the cooling of all the components of the circuit board, using liquid regardless of the nature of the electronic components: the low-level and mid-level components by the cold plate and the components known as high-level components such as the processors and memory modules by the single-phase heat sinks having a cooling block.

Low-level and mid-level electronic components are understood, within the meaning of the present invention, to be any component of the circuit board that has a height less than a threshold height, below which it can be cooled by the cold plate cooling circuit. As regards the low-level and mid-level electronic components, these are generally the power supply or voltage regulator.

High-level electronic components are understood, within the meaning of the present invention, to be any component of the circuit board that is not cooled by the cold plate cooling circuit since they have to remain accessible without dismounting of the cold plate. These are electronic components that require rapid maintenance such as the processors or the memory modules.

The cooling system according to the present invention, on account of its structure with cooling blocks connected to the cooling circuit of the cold plate by flexible connections, allows a great deal of flexibility for dismounting the processors and ensures reliability of the connections after a large number of dismounting operation cycles. Sealing at 10 bar is ensured by the cooling system according to the invention, including after several dismounting operations.

The cooling system according to the present invention, on account of its structure with cooling blocks connected to the cooling circuit of the cold plate by flexible connections, allows the installation of a plurality of, for example six, heat sinks in series or in parallel.

The heat sink of the cooling system according to the present invention also has itself to meet a dimensional requirement defined by the size of the processors and by the available space on the cold plates for judiciously distributing the cooling fluid.

The heat sink of the cooling system according to the present invention also makes it possible to meet requirements of mass production, on account of its ease of production and assembly with the cold plate by flexible connections.

The intermediate part of the cooling block has a slot. In this configuration, the heat transfer fluid, when it arrives in the cooling block, passes through a very thin slot or blade, which allows it to be distributed in an equitable manner in the exchange surface by way of the fins. The shape of this distributor and its distance from the fins have been studied so as to obtain the largest possible Reynolds number in the available dimensions.

Preferably, the slot in the intermediate part of the cooling block will be chosen to be oriented perpendicularly to the direction of the fins, so as to maximize the exchange coefficient between the fluid and the solid surface of the fins.

According to an advantageous embodiment of the cooling block, the intermediate part of the cooling block may be made up of a distribution plate in which the through-slot is provided.

In such an embodiment, the distribution plate may be in the approximate form of a rectangular parallelepiped, one of the sides of which is provided with a step that fits into the part of the peripheral zone of the main heat exchange zone that is situated under the inlet connector, without covering the part of the peripheral zone under the outlet connector.

According to an advantageous embodiment of the cooling block, fins, preferably straight fins, will be used for the support plate of the cooling block. In this case, the straight fins may have a thickness of 0.2 mm and be spaced apart from one another by a distance of 0.4 mm. The spacing between two fins is preferably likewise 0.2 mm.

The use of fins makes it possible to increase the exchange surface area and also to increase the turbulence in the flow in order to improve the heat exchange coefficient.

The straight fins make it possible to create a jet flow (also known as a liquid jet) and to obtain turbulent flow conditions even with very low speeds and pressure drops.

The liquid cooling system according to the present invention therefore makes it possible to combine a large exchange surface and a convective coefficient that is optimized at the center of the processor by virtue of its flow as a centered jet. It also makes it possible to obtain a reduction in the hydraulic diameter and the flow cross sections, thereby conferring a greater speed on the fluid and thus improving convective exchanges. This type of flow also makes it possible to center the convective heat transfer peak in contrast to longitudinal flows, which do not optimize exchange as close as possible to the processor.

BRIEF DESCRIPTION OF THE DRAWINGS

Further advantages and particular features of the present invention will become apparent from the following examples below, which are given by way of nonlimiting example and with reference to the appended figures.

For greater clarity, elements that are identical or similar have been identified in these figures by reference signs that are identical in all of the figures.

Figure 2:
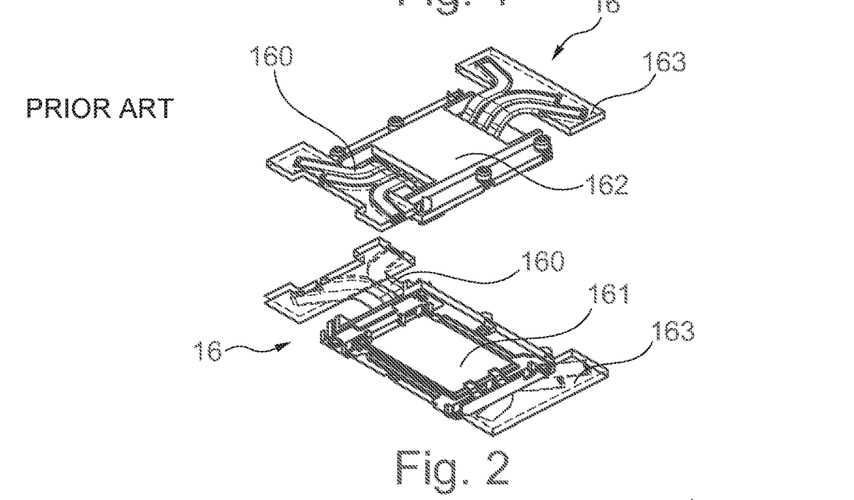
FIG. 2 a two-phase heat sink of a circuit board cooling system known from the prior art and belonging to the applicant company.
Figure 3:
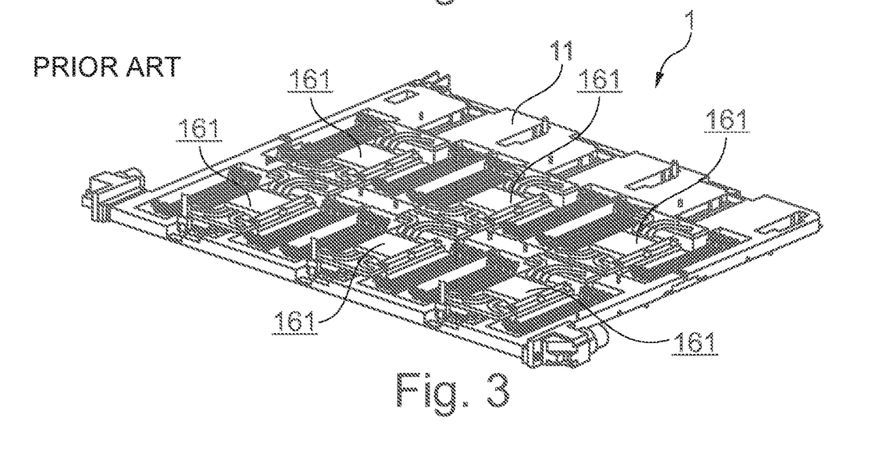
FIG. 3 shows the cooling system known from the prior art incorporating the heat sink illustrated in FIG. 2.

FIGS. 1 to 3 are described in more detail in the preceding part of the description, relating to the description of the solutions known from the prior art.

FIGS. 4 to 8 are described in more detail in the following part of the description, relating to the detailed description of an embodiment of the liquid cooling system according to the present invention.

FIGS. 9 to 12 are described in more detail in the following examples, which illustrate the present invention without limiting the scope thereof.

DESCRIPTION OF AN EMBODIMENT

Figure 4:
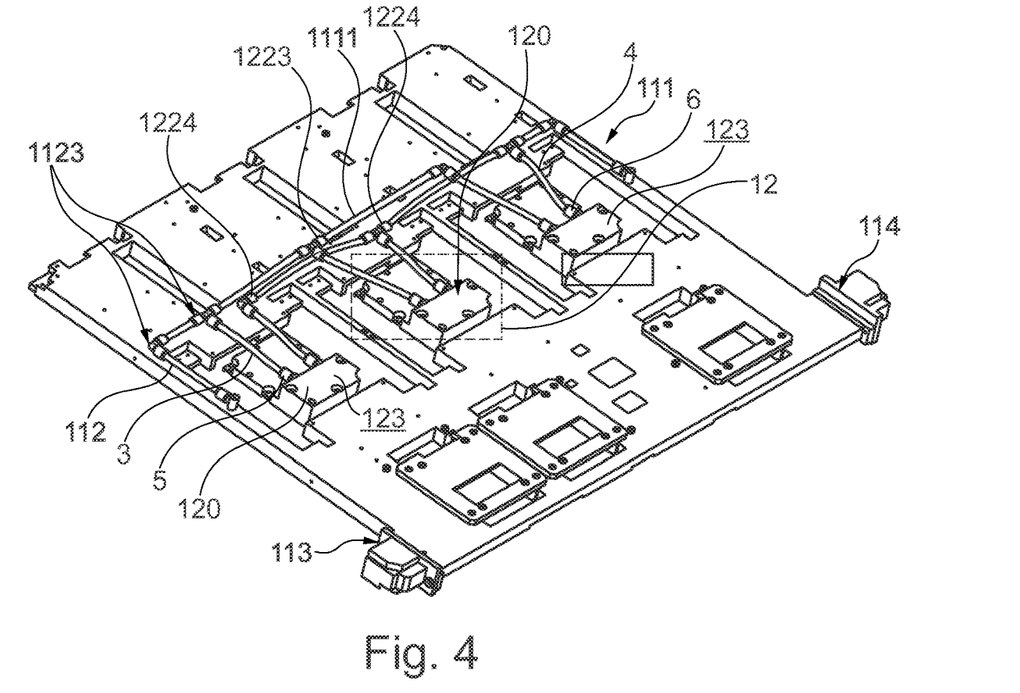
FIG. 4 is a schematic depiction of the liquid cooling system according to the present invention, showing the distribution of the heat transfer fluid in the flexible secondary ducts through the heat sinks.

FIG. 4 schematically shows an embodiment of a liquid cooling system 1 according to the present invention having three heat sinks 12. FIG. 4 more particularly shows the distribution of the heat transfer fluid 112 in a secondary network of flexible secondary ducts 1111 through the heat sinks 12.

Figure 8:
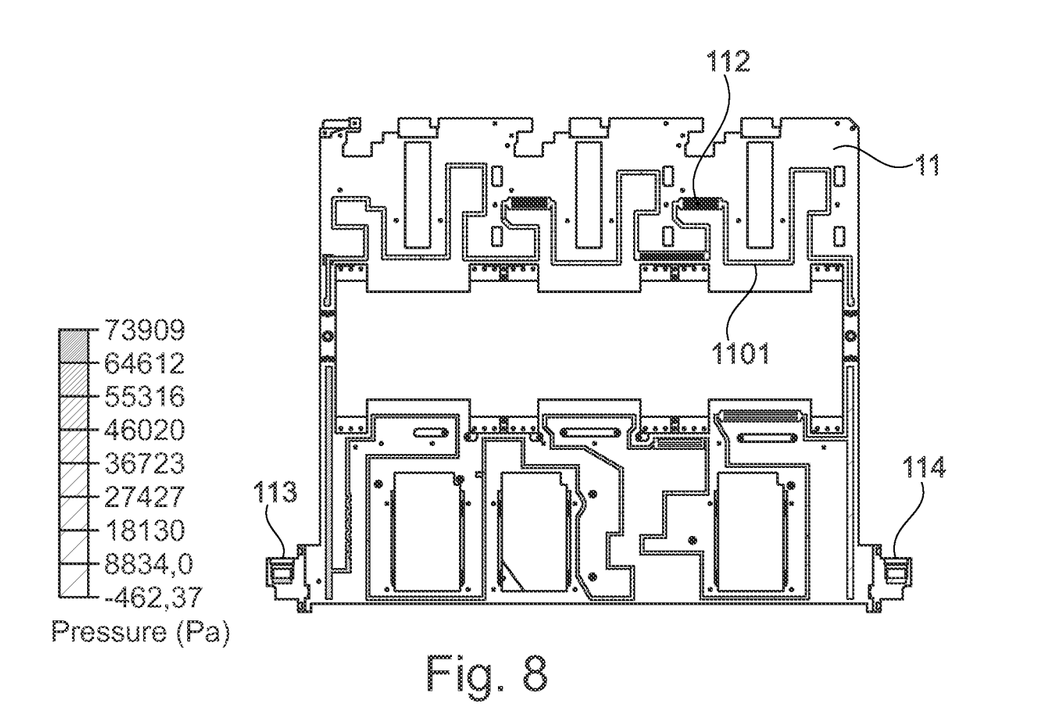
FIG. 8 shows the result of a digital simulation of the change in head loss in the primary cooling circuit of the cold plate, which is part of a liquid cooling system according to the present invention having three cooling blocks.
Figure 9:
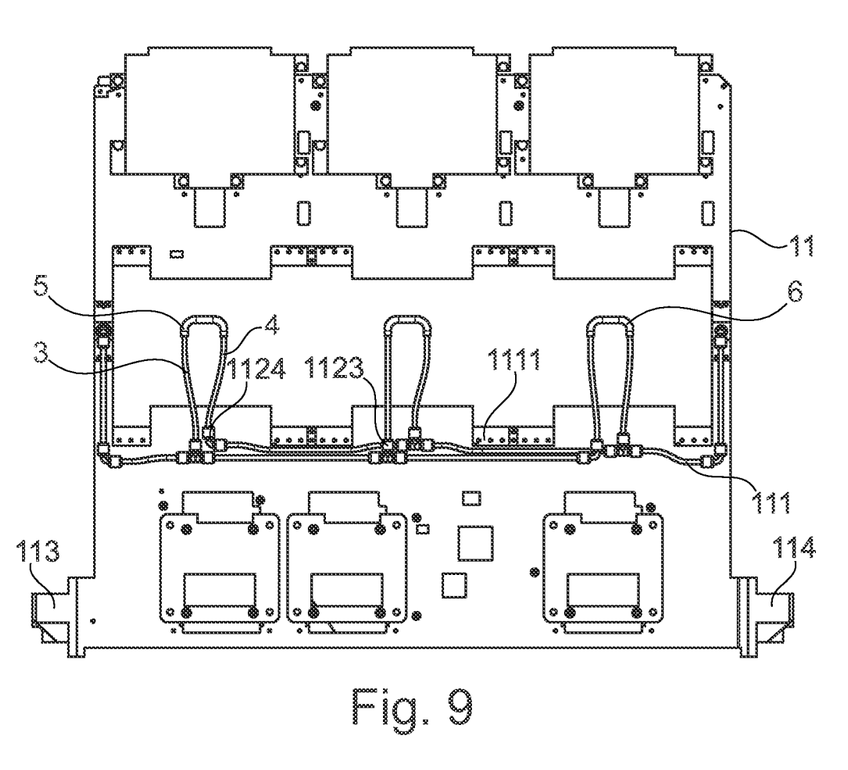
FIG. 9 is a schematic depiction of the simplified hydraulic model of the liquid cooling system according to the present invention, corresponding to the one for which the digital simulation illustrated in FIG. 9 has been carried out.
Figure 10:
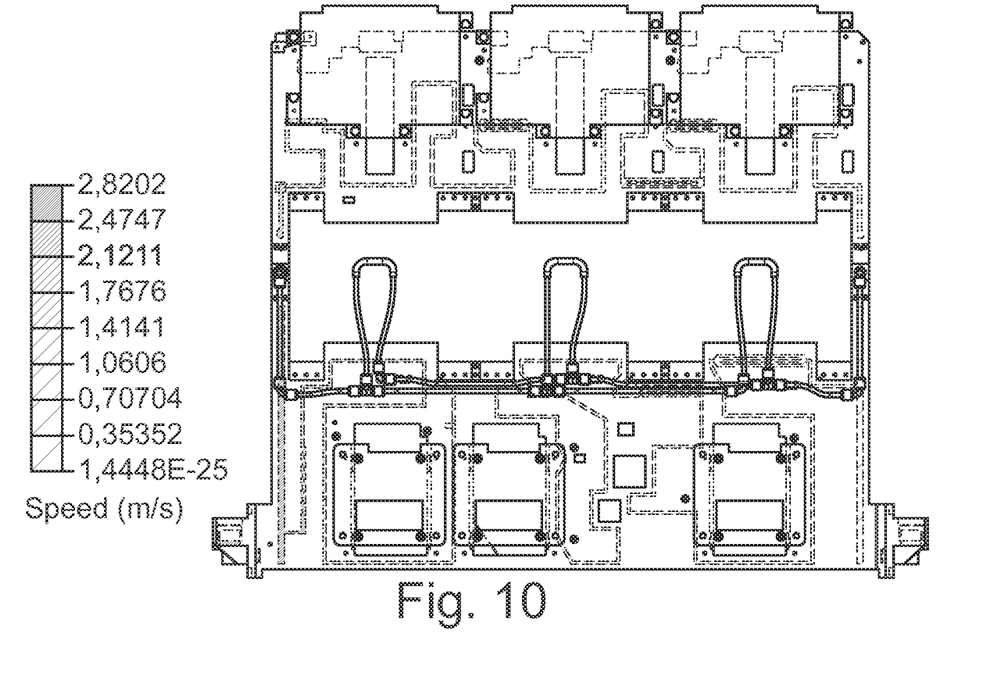
FIG. 10 shows the result of a digital simulation of the change in the velocity field in the primary cooling circuit of the cold plate, which is part of a liquid cooling system according to the present invention corresponding to the one in FIGS. 9 and 10.

The full mounting of the liquid cooling system 1 according to the present invention on a circuit board 2 having three processors 23 (visible in FIG. 5) is shown in the photograph in FIG. 8. The circuit board 2 includes, in addition to the processors 23, a plurality of low-level and mid-level electronic components 21, 22 (visible by transparency in FIG. 5) that are secured to a substrate 21.

FIG. 8 shows that, for the one part, a cold plate 11 having external dimensions more or less equal to those of the substrate of the circuit board 2 such that it covers the entire substrate 21 and the low-level and mid-level electronic components 22 secured thereto, and, for the other part, three heat sinks 12 that each includes a main heat exchange zone 121 (visible in FIG. 6) that is able to bear against a processor 23.

The cold plate 11 may advantageously be a plate made of a heat conducting material such as aluminum. It includes a primary 110 cooling circuit 110 (visible in the simulation in FIG. 9) with main ducts 1101 within which a heat transfer fluid 112 such as glycol water flows. The heat transfer fluid 112 is fed into the cold plate 11 via an inlet connector 113 and the heat transfer fluid 112 is discharged from the cold plate 11 via an outlet connector 114.

Figure 5:
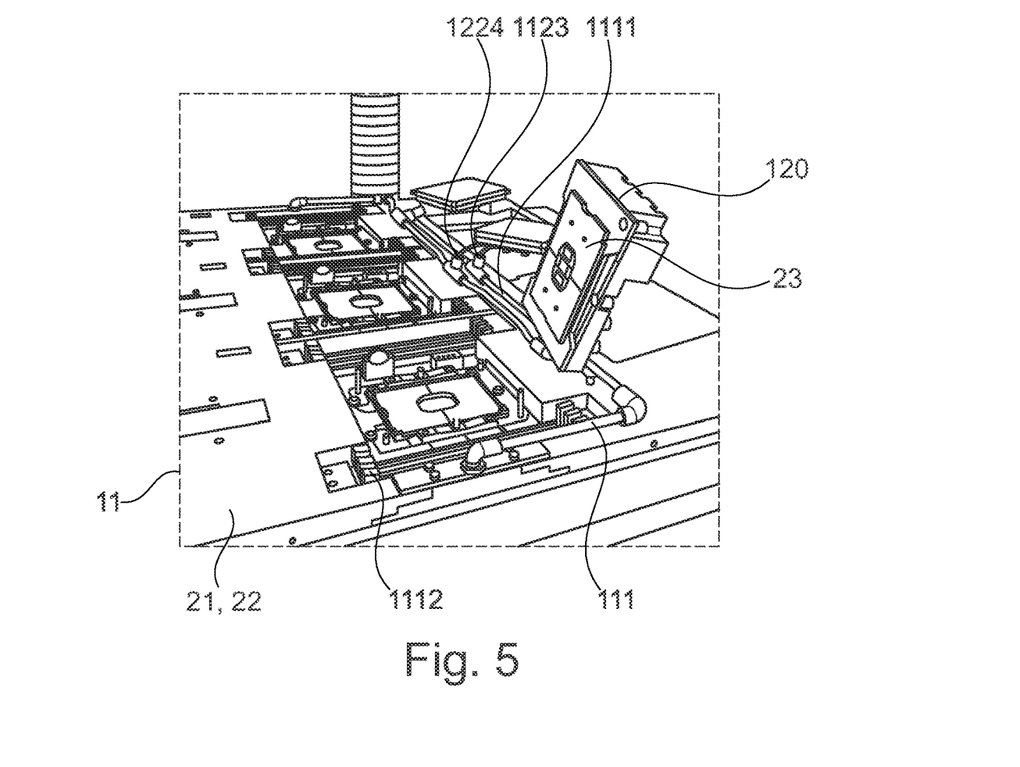
FIG. 5 is a photograph showing, in a liquid cooling system according to the present invention having a plurality of these cooling blocks, the kinematics of rotation of one of these blocks with respect to a duct of the secondary cooling circuit.

FIG. 5 furthermore shows how the liquid cooling system 1 according to the present invention is linked to the primary cooling circuit 110 of the cold plate, by virtue of single-phase heat sinks 12 (likewise visible in FIG. 4) and a secondary circuit 111 of flexible secondary ducts 1111 connected to the main ducts 1101 of the primary circuit 111 by angled connectors 1112 screwed into the cold plate 11.

The heat sinks 12 are single-phase heat sinks that each includes (see also FIG. 4):
- a cooling block 120 made of heat conducting material,
- an inlet duct 3 and an outlet duct 4 that are connected, for the one part, to the upper part 123 of the cooling block 120 via an inlet connector 5 and an outlet connector 6, respectively, and, for the other part, to a flexible secondary duct 1111 of the secondary circuit 111 via an angled connector 1223, 1224.

The structure of the heat sink of the cooling system according to the present invention is therefore such that the cooling block is supplied with the heat transfer fluid 112 flowing in the cold plate 11.

FIG. 5 clearly shows that these angled connectors 1223, 1224 allow the inlet and outlet ducts 3, 4 to rotate with respect to the flexible secondary duct 1111 to which they are connected.

Figure 6:
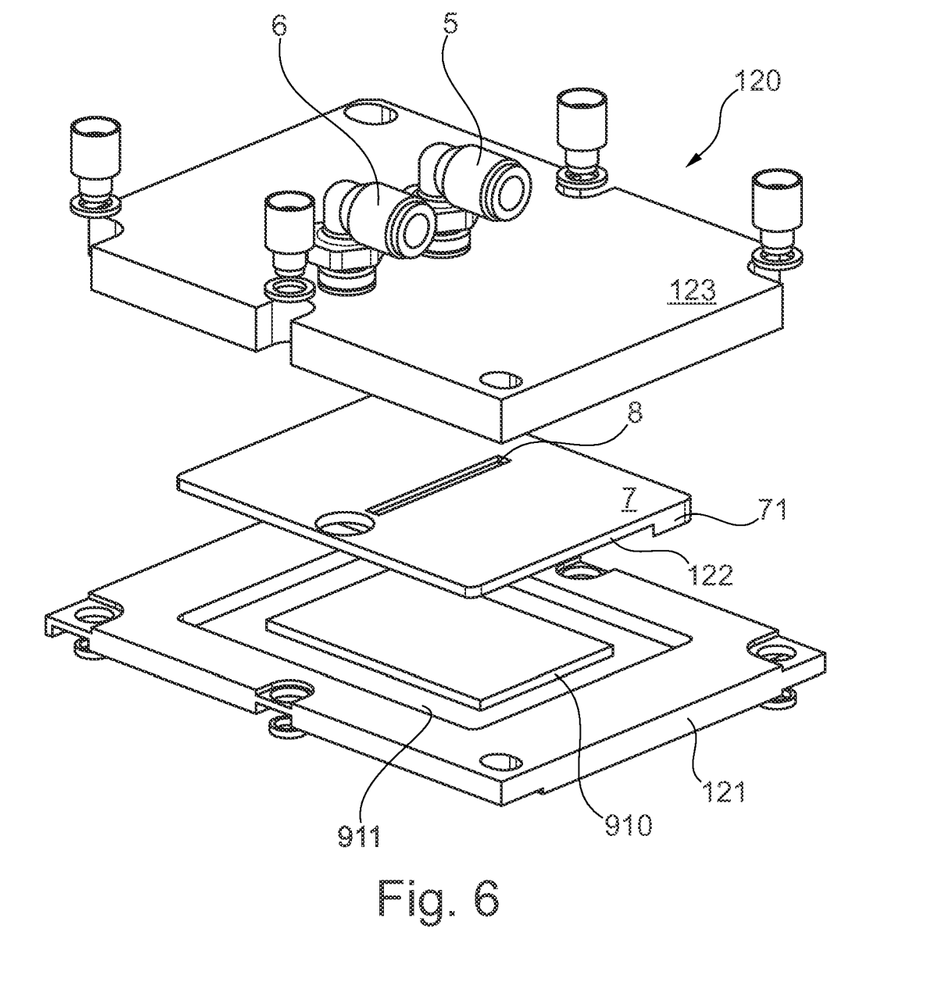
FIG. 6 is a schematic exploded view of an embodiment of a heat sink that can be used in a liquid cooling system according to the present invention.
Figure 7:
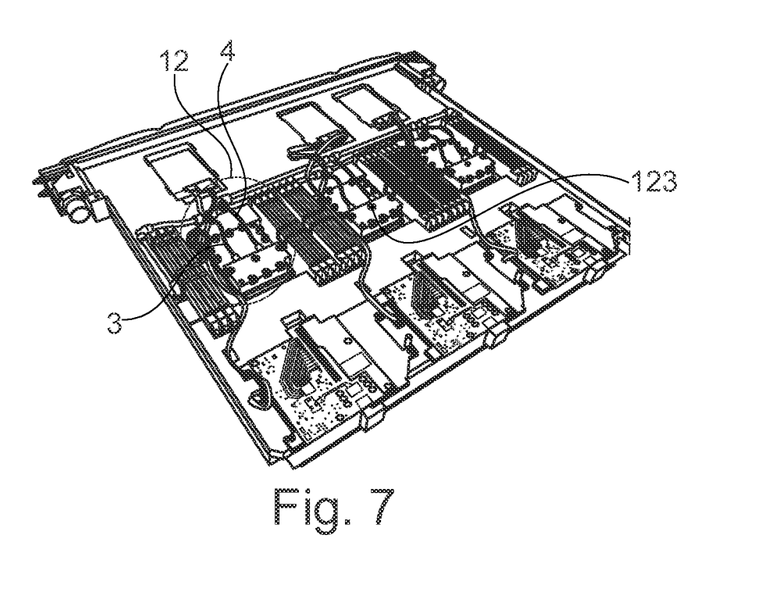
FIG. 7 is a photograph showing the full mounting of the liquid cooling system according to the present invention on three circuit boards, each having a processor.

FIG. 6 is a schematic exploded view of an embodiment of a heat sink 12 that can be used in a liquid cooling system 1 according to the present invention. This figure shows that the heat sink that can be used in the scope of the present invention includes a lower part forming a main heat exchange zone 121, an intermediate part 122 known as the distribution part, and an upper part 123 connected to the cold plate 11. A through-slot 8 is situated in the intermediate part 122 in order to uniformly distribute the flow of the heat transfer fluid 112 coming from the upper part 123 in the form of a centered jet toward a support plate 9 situated in the main heat exchange zone 121. This support plate 9 includes a recessed central part 91 with a zone provided with fins 910 in order to generate turbulence in the flow conditions of the heat transfer fluid 112, and a zone 911 peripheral to the zone provided with fins 910 in order to receive the heat transfer fluid 112 and direct it toward the outlet connector 6.

By virtue of the liquid cooling system 1 according to the present invention, the processors will be 10° C. less hot than if use were made of the cooling system known from the prior art shown in FIG. 3 (system having heat pipes: see also FIG. 2) having heat pipes. By virtue of the liquid cooling system according to the present invention, it is therefore possible to cool more powerful processors.

EXAMPLES

The simulated hydraulic behavior of the liquid cooling system according to the present invention (having three processors) as shown in FIGS. 4 to 8.
Calculation Conditions
The calculation conditions were the following:
Model simulating the conduction and convection with the heat transfer fluid, the natural convection and radiation with the ambient air around the cold plate having been disregarded;
Blade inlet flow rate=3l/min ($5.10^{-5}$ m$^3$/s);
Temperature of the heat transfer fluid at the blade inlet=44° C.;
Heat transfer fluid used: PEG MB633 (mixture of water+PEG)
Head loss target for equalizing the blades: 70 kPa Target for $\Delta T_{inlet-outlet}$ on the blade: around 7° C.

EXAMPLE 1: hydraulic simulation of the cooling system according to the present invention having three cooling blocks (as shown in FIGS. 4 to 7).

The result of the digital simulation of the change in head loss in the primary cooling circuit of the cold plate is shown in FIG. 8. An optimization operation made it possible to achieve the head loss target of around 70 kPa in the cold plate at 3 l/min (as shown in FIG. 8 and the scale).

The head loss target for equalizing blades is 70 kPa. The value calculated of the overall head loss of the cold plate is around 75 kPa, which is close to the target value.

EXAMPLE 2: thermal simulation of the cooling system according to the present invention having three cooling blocks (as shown in FIGS. 4 to 7).

Figure 11:
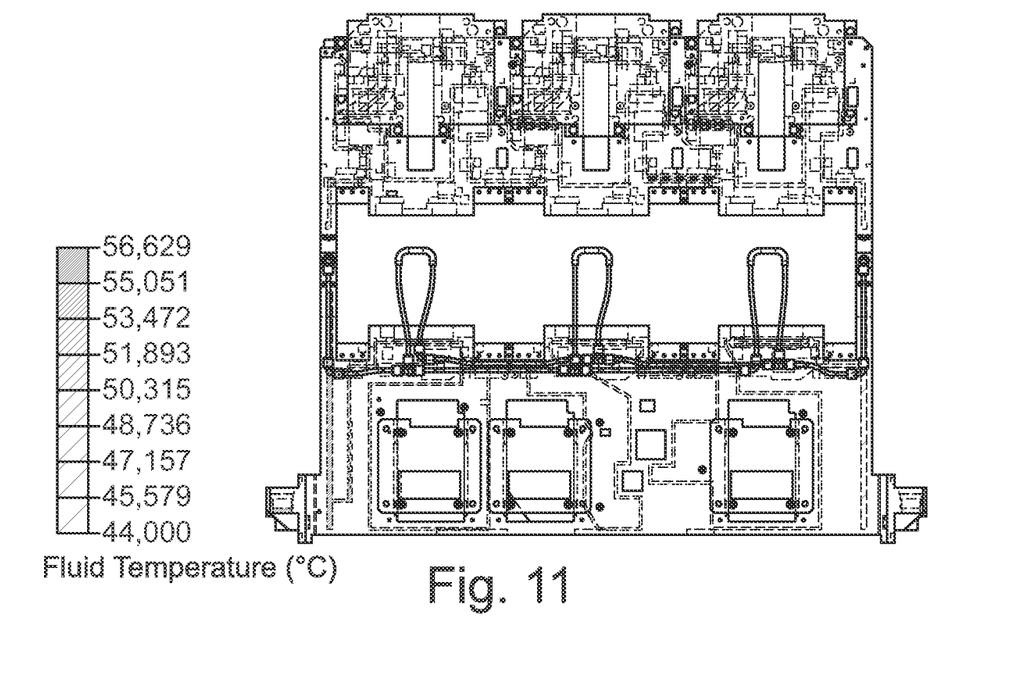
FIG. 11 shows the result of a digital simulation of the heating of the heat transfer fluid in the primary cooling circuit of the cold plate, which is part of a liquid cooling system according to the present invention corresponding to the one in FIGS. 9, 10 and 11; in this figure, the heating of the fluid in the representative pipes of the cooling block can also be seen.
Figure 12:
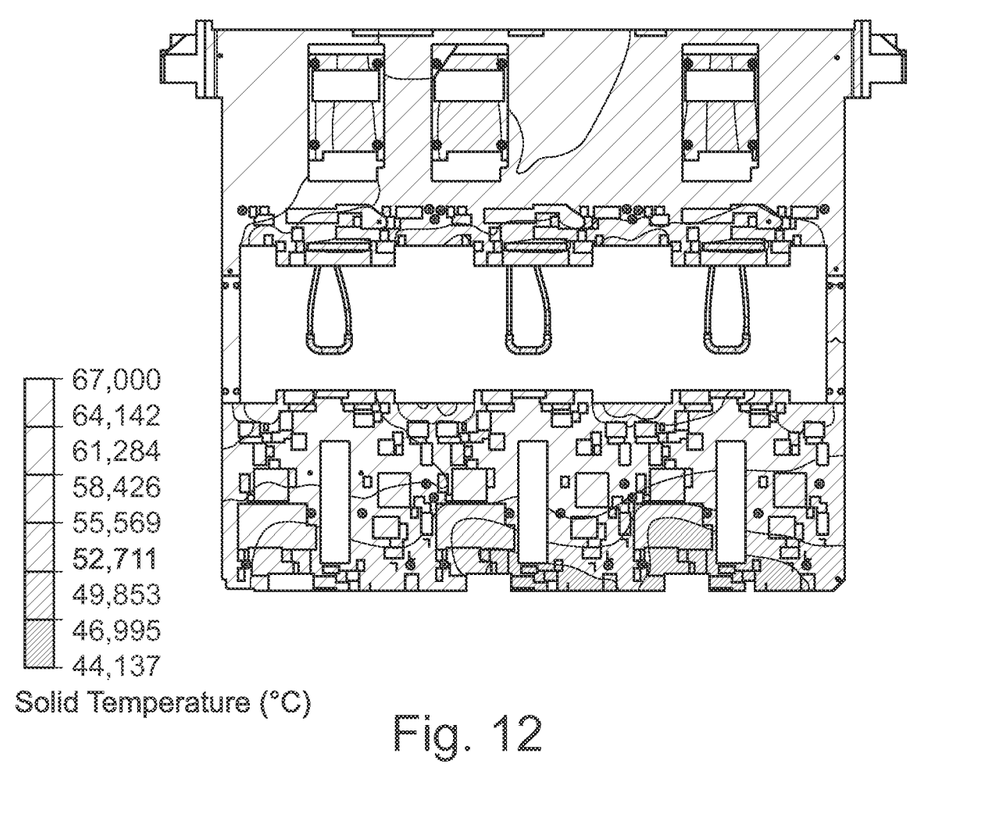
FIG. 12 shows the result of the temperature field in the cold plate (view from below, that is to say from the circuit board side).

FIG. 11 shows the result of a digital simulation of the heating of the heat transfer fluid in the primary cooling circuit of the cold plate, and FIG. 12 shows the result of the temperature field of the cold plate (view from below). Heat sources are applied directly to the cold plate at the location of the mid-level and low-level components. The result of the simulation gives a plate temperature at the interface with each of the components (mid-level and low-level).

Heating of the fluid within the cold plate is observed, the inlet of the cold plate is clearly at 44° C. since this is an input data item for the calculation (limit condition). The outlet is around 52° C. There is therefore a temperature gradient of about 8° C. between the inlet and the outlet of the fluid.

The invention claimed is:

1. A system comprising: a circuit board comprising a substrate, and a plurality of electronic components secured to said substrate that comprise low-level and mid-level electronic components and a high-level electronic component; a liquid cooling system in communication with said circuit board, wherein said liquid cooling system comprises: a cold plate having external dimensions approximately equal to external dimensions of said substrate such that said cold plate entirely covers said substrate, and said low-level and mid-level electronic components, said cold plate being made of a heat conducting material and comprising a primary pooling circuit comprising main ducts within which a heat transfer fluid flows, said heat transfer fluid being fed into said cold plate via an inlet connector and said heat transfer fluid being discharged from said cold plate via an outlet connector, a heat sink comprising a main heat exchange zone that is able to bear against said high-level electronic component; a secondary circuit comprising flexible secondary ducts connected to the main ducts of the primary circuit by angled connectors secured in said cold plate, wherein said heat sink is a single-phase heat sink comprising: a cooling block made of heat conducting material comprising a lower part forming said main heat exchange zone, an intermediate part, and said upper part connected to said cold plate, wherein one part of said inlet duct is connected to said upper part of said cooling block via said inlet connector and one part of said outlet duct is connected to said upper part of said cooling block said outlet connector, and a second part of said inlet duct is connected, to a flexible secondary duct of the secondary circuit via a first angled connector and a second part of said outlet duct is connected to said flexible secondary duct via a second angled connector, such that said cooling block is supplied with said heat transfer fluid flowing in said cold plate, said first angled connector and said second angled connector being able to avow said inlet duct and said outlet duct to rotate with respect to said flexible secondary duct to which they are connected, and wherein said cooling block comprises: a through-slot situated in said intermediate part in order to uniformly distribute a flow of said heat transfer coming from said upper part in a form of a centered jet toward a support plate-that is situated in the main heat exchange zone and comprises a recessed central part with a zone provided with fins or spikes in order to generate turbulence in the flow conditions of said heat transfer fluid, and a zone peripheral to said zone provided with fins or spikes in order to receive the heat transfer fluid and direct it toward said outlet connector.

2. The system of claim 1, wherein said fins are straight fins.

3. The system of claim 2, wherein said fins have a thickness of 0.2 mm and are spaced apart from one another by a distance of 0.4 mm.

4. The system of claim 1, wherein an orientation of said through-slot is perpendicular to a direction of said fins.

5. The system of claim 1, wherein said intermediate part comprises a distribution plate in which said through-slot is provided.

6. The system of claim 5, wherein said distribution plate is in the approximate form of a rectangular parallelepiped comprising, a step that fits into a part of said peripheral of the main heat exchange that is situated under said inlet connector (5), without covering said part of said peripheral zone that is situated under said outlet connector.

7. The system of claim 1, wherein said high-level electronic component is a processor.

* * * * *

UNITED STATES PATENT AND TRADEMARK OFFICE
CERTIFICATE OF CORRECTION

PATENT NO. : 11,129,305 B2  
APPLICATION NO. : 16/772915  
DATED : September 21, 2021  
INVENTOR(S) : Marc Raeth Page 1 of 1

It is certified that error appears in the above-identified patent and that said Letters Patent is hereby corrected as shown below:

In the Claims

Column 8, Claim 1, Line 13, delete "pooling" and insert in its place --cooling--.

Column 8, Claim 1, Line 36, delete "avow" and insert in its place --allow--.

Column 8, Claim 6, Line 63, delete "(5)".

Signed and Sealed this  
Seventh Day of December, 2021

Drew Hirshfeld  
*Performing the Functions and Duties of the*  
*Under Secretary of Commerce for Intellectual Property and*  
*Director of the United States Patent and Trademark Office*